US012123912B2

(12) United States Patent
Bhunia et al.

(10) Patent No.: US 12,123,912 B2
(45) Date of Patent: Oct. 22, 2024

(54) RECONFIGURABLE JTAG ARCHITECTURE FOR IMPLEMENTATION OF PROGRAMMABLE HARDWARE SECURITY FEATURES IN DIGITAL DESIGNS

(71) Applicant: University of Florida Research Foundation, Incorporated, Gainesville, FL (US)

(72) Inventors: Swarup Bhunia, Gainesville, FL (US); Christopher Vega, Gainesville, FL (US); Reiner Dizon, Gainesville, FL (US); Rohan Reddy Kalavakonda, Gainesville, FL (US); Patanjali Sristi Lakshmiprasanna Sriramakumara, Gainesville, FL (US)

(73) Assignee: University of Florida Research Foundation, Incorporated, Gainesville, FL (US)

( * ) Notice: Subject to any disclaimer, the term of this patent is extended or adjusted under 35 U.S.C. 154(b) by 50 days.

(21) Appl. No.: 17/661,232

(22) Filed: Apr. 28, 2022

(65) Prior Publication Data

US 2022/0357394 A1 Nov. 10, 2022

Related U.S. Application Data

(60) Provisional application No. 63/183,994, filed on May 4, 2021.

(51) Int. Cl.
*G01R 31/3185* (2006.01)
*G01R 31/28* (2006.01)
*G01R 31/317* (2006.01)

(52) U.S. Cl.
CPC .............. *G01R 31/318536* (2013.01); *G01R 31/2815* (2013.01); *G01R 31/31713* (2013.01);
(Continued)

(58) Field of Classification Search
CPC .... G01R 31/318533; G01R 31/318536; G01R 31/31713; G01R 31/318555;
(Continued)

(56) References Cited

U.S. PATENT DOCUMENTS 5,570,375 A * 10/1996 Tsai ............... G01R 31/318536
714/30
7,409,612 B2 * 8/2008 Van De Logt .............................
G01R 31/318541
324/750.3

(Continued)

OTHER PUBLICATIONS

Guo et al., A Novel Configurable Boundary-scan Circuit Design of SRAM-Based FPGA, 2011, IEEE, pp. 335-338. (Year: 2011).*
Blaquière et al., Design and Validation of a Novel Reconfigurable and Defect Tolerant JTAG Scan Chain, 2014, IEEE, pp. 2559-2562. (Year: 2014).*
Ben Ahmed et al., Boundary Scan Extension for Testing Distributed Reconfigurable Hardware Systems, Jul. 2019, IEEE, vol. 66 , No. 7, pp. 2699-2708. (Year: 2019).*

(Continued)

*Primary Examiner* — John J Tabone, Jr.
(74) *Attorney, Agent, or Firm* — ALSTON & BIRD LLP

(57) ABSTRACT

A reconfigurable JTAG includes, in part, a core logic, a boundary scan chain cell, one or more reconfigurable blocks (RBs), and a reconfigurable block (RB) programming module. The RBs may include, in part, one or more reconfigurable boundary scan chain blocks (RBB) adapted to couple the boundary scan chain cell to the core logic and to input/output (I/O) ports of the reconfigurable JTAG. The RBs may also include, in part, one or more additional reconfigurable logic (ARL) blocks to provide enhanced logic for locking operations. The RB programmable module may communicate with a memory storing data for configuring the RBBs and ARLs. The RB programming module may configure the RBBs and ARLs based at least in part on (Continued)

the data stored in the memory to disable access to the I/O ports of the JTAG. The RB programming module may configure the RBBs to encrypt the I/O ports in accordance with a cipher algorithm. The RB programming module may also configure the RBBs and ARLs to compare a counter's count to a predefined time and lock the I/O ports after an expiration of the predefined time.

17 Claims, 12 Drawing Sheets

(52) U.S. Cl.
 CPC ............... *G01R 31/318533* (2013.01); *G01R 31/318555* (2013.01); *G01R 31/318588* (2013.01); *G01R 31/318597* (2013.01)
(58) Field of Classification Search
 CPC ........ G01R 31/318588; G01R 31/2815; G01R 31/318597
 USPC .......................................... 714/727, 726, 729
 See application file for complete search history.

(56) References Cited

U.S. PATENT DOCUMENTS

| | | | |
|---|---|---|---|
| 7,752,004 B1* | 7/2010 | Gajendran | G01R 31/318558 702/123 |
| 2006/0100810 A1* | 5/2006 | Van De Logt | G01R 31/318541 702/117 |
| 2007/0192874 A1* | 8/2007 | Tucker | H04L 9/12 726/28 |
| 2013/0086441 A1* | 4/2013 | Yang | G01R 31/318555 714/E11.155 |
| 2017/0176530 A1* | 6/2017 | Cottrell | G01R 31/31719 |
| 2020/0184089 A1* | 6/2020 | Ponsini | G06F 21/606 |
| 2021/0335444 A1* | 10/2021 | Mondello | G11C 29/16 |
| 2021/0391985 A1* | 12/2021 | Bhunia | H04L 9/0861 |
| 2022/0357394 A1* | 11/2022 | Bhunia | G01R 31/318536 |

* cited by examiner

RECONFIGURABLE JTAG ARCHITECTURE FOR IMPLEMENTATION OF PROGRAMMABLE HARDWARE SECURITY FEATURES IN DIGITAL DESIGNS

CROSS-REFERENCE TO RELATED APPLICATION

The present application claims benefit under 35 USC 119(e) of U.S. Application Ser. No. 63/183,994, filed May 4, 2021, which is incorporated herein by reference in its entirety.

SUPPORT STATEMENT

This invention was made with government support under 1662976 awarded by The National Science Foundation. The government has certain rights in the invention.

TECHNICAL FIELD

The present application relates to integrated circuits, and more particularly to integrated circuits that include reconfigurable logic.

BACKGROUND

The Joint Test Action Group (JTAG) architecture allows for on-the-field testing of integrated circuits (ICs) by monitoring the boundary scan cells that are coupled to the inputs and outputs of an IC. The JTAG provides direct access to the inputs and outputs (I/O) of an IC, which can be prone to reverse engineering attacks and information leakage. The addition of security provisions to the IC, such as logic locking and obfuscation, does not shield from attacks when the attacker has access to the IC's I/O (also referred to herein as I/O pins). Therefore, additional mechanisms are necessary to secure the I/O from potential attacks. Attacks such as Satisfiability Attack (SAT) and Key Sensitization Attack (KSA) have shown that it is still possible to reveal information about a device even when such features are used in the IC. For SAT, unencrypted output is used with satisfiability solvers in order to determine information about a circuit. This can reveal design implementation or information such as secret keys. For KSA, the attacker observes the output of a circuit when applying input patters. If no mask is applied to the key bit, an attacker can use this vulnerability to reveal the value of the key.

A number of known JTAG architectures, such as Secure JTAG which uses Challenge-Response Pairs, include locking mechanisms adapted to disable some of the functionalities of the IC. Another known implementation of the JTAG protects the instruction register using two security modules. In yet another known implementation of the JTAG, the scan chain's integrity is protected by using chained hashing on the history of data sent through the boundary scan chain.

Existing JTAG architectures, however, have a number of shortcomings. For example, they limit the flexibility of system integrators to implement their own locking schemes. Because they lack a unified architecture, existing systems require the use of different JTAG architectures for different locking mechanisms in the same design. Moreover, the limited number of current technologies, coupled with the fact that they are hard-coded, limit the choices of system integrators in selecting a locking scheme. A need continues to exist for an expanded JTAG architecture adapted to implement a flexible locking mechanism without affecting the original functionality of JTAG.

SUMMARY

A reconfigurable JTAG, in accordance with some embodiments of the present disclosure, includes, in part, a core logic, a boundary scan chain cell, and one or more reconfigurable blocks (RBs). In some embodiments, the RBs include, in part, one or more reconfigurable boundary scan chain blocks (RBB) adapted to couple the boundary scan chain cell to the core logic and to input/output (I/O) ports of the reconfigurable JTAG. In some embodiment, the RBs further include, in part, one or more additional reconfigurable logic (ARL) blocks to provide enhanced logic for locking operations.

In some embodiments, the reconfigurable JTAG further includes, in part, a reconfigurable block (RB) programming module. The RB programming module is configured to communicate with a memory storing data for configuring the RBBs and ARLs. The RB programming module is further configured to configure the RBBs and ARLs based at least in part on the data stored in the memory.

In some embodiments, the RBBs and ARLs are configured to disable access to the I/O ports of the JTAG. In some embodiments, the RBBs are configured to encrypt the I/O ports in accordance with a stream cipher algorithm. In some embodiments, the RBBs and ARLs are configured to compare a counter's count to a predefined time (alternatively referred to herein as a predefined value, a predefined time interval, or a predefined time value) and lock the I/O ports after an expiration of the predefined time.

In some embodiments, the RBBs and ARLs comprise at least one of configurable logic blocks (CLB), domain-specific reconfigurable logic (DSRL) blocks, or one-time programmable (OPT) memory.

In some embodiments, each of the ARLs is coupled to a plurality of the RBBs in the reconfigurable JTAG. In some embodiments, at least one of the ARLs can be configured as a timer and/or a counter.

In some embodiments, the reconfigurable JTAG complies with IEEE 1149.1 standard.

A method for protecting input/output (I/O) ports of a reconfigurable JTAG, in accordance with some embodiments of the present disclosure, includes, in part, configuring one or more reconfigurable blocks (RB) disposed in the JTAG to disable access to the I/O ports of the JTAG. In some embodiments, the reconfigurable JTAG includes, in part, a core logic, a boundary scan chain cell, and the one or more RBs. In some embodiments, the one or more RBs comprises one or more reconfigurable boundary scan chain blocks (RBB) adapted to couple the boundary scan chain cell to the core logic and to the I/O ports of the JTAG. In some embodiments, the one or more RBs further comprises one or more additional reconfigurable logic (ARL) blocks to provide enhanced logic for locking operations. In some embodiments, the RBBs and ARLs comprise at least one of configurable logic blocks (CLB), domain-specific reconfigurable logic (DSRL) blocks, or one-time programmable (OPT) memory. In some embodiments, each of the ARLs is coupled to a plurality of the RBBs. In some embodiments, at least one of the ARLs is configured as a timer and/or a counter. In some embodiments, the reconfigurable JTAG complies with IEEE 1149.1 standard.

In some embodiments, the method further includes, in part, configuring a reconfigurable block (RB) programming module to communicate with a memory storing data for configuring the RBBs and ARLs. The RB programming module is disposed in the JTAG. In some embodiments, the method further includes, in part, configuring the RB programming module to configure the RBBs and ARLs to perform certain locking operations based at least in part on the data stored in the memory.

In some embodiments, the method for protecting I/O ports of the reconfigurable JTAG includes, in part, configuring the RBBs to encrypt the I/O ports in accordance with a stream cipher algorithm.

In some embodiments, the method for protecting I/O ports of the reconfigurable JTAG includes, in part, configuring the RBBs and ARLs to compare a counter's count to a predefined time and lock the I/O ports after an expiration of the predefined time.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Embodiments of the present disclosure relate to an integrated circuit (IC) that includes enhanced reconfigurable logic. The reconfigurable logic may be used to improve the security features at Input/Output (I/O) of the IC.

Malicious parties often try to gain unauthorized access to an IC. While software-based security features can be easily hacked, in recent days attackers have been able to gain access even with the implementation of hardware-based security features. Unlike software vulnerabilities which can be easily patched or fixed with an update, hardware vulnerabilities leave a permanent impact. Hardware vulnerabilities are more difficult and often more expensive to fix. This has led to the exploration of reconfigurable logic based solutions for hardware security.

In accordance with one embodiment of the present disclosure, a reconfigurable JTAG enhances, in part, the test architecture of an integrated circuit. The reconfigurable JTAG includes, in part, a JTAG interface/architecture, a boundary scan chain/architecture, and a reconfigurable logic disposed between the IC core and the I/O of the IC. The reconfigurable JTAG provides extra security features to the I/O of an IC and enables the updating of existing security to patch vulnerabilities. The JTAG interface provides for reprogramming of the reconfigurable logic without requiring additional interfaces, thereby enabling a user/designer to implement custom hardware security features based on the field requirements.

As described above, embodiments of the present invention extend the functionality of the JTAG architecture by adding reconfigurable blocks to protect the I/O of the IC and the data on the JTAG's boundary scan chain. The architecture provides for flexible implementation of custom I/O locking mechanisms by system integrators, and further provides for the expansion of the JTAG architecture through placement of Reconfigurable Blocks (RBs) about the boundary scan cells in order to enable flexible I/O locking schemes.

Figure 1:
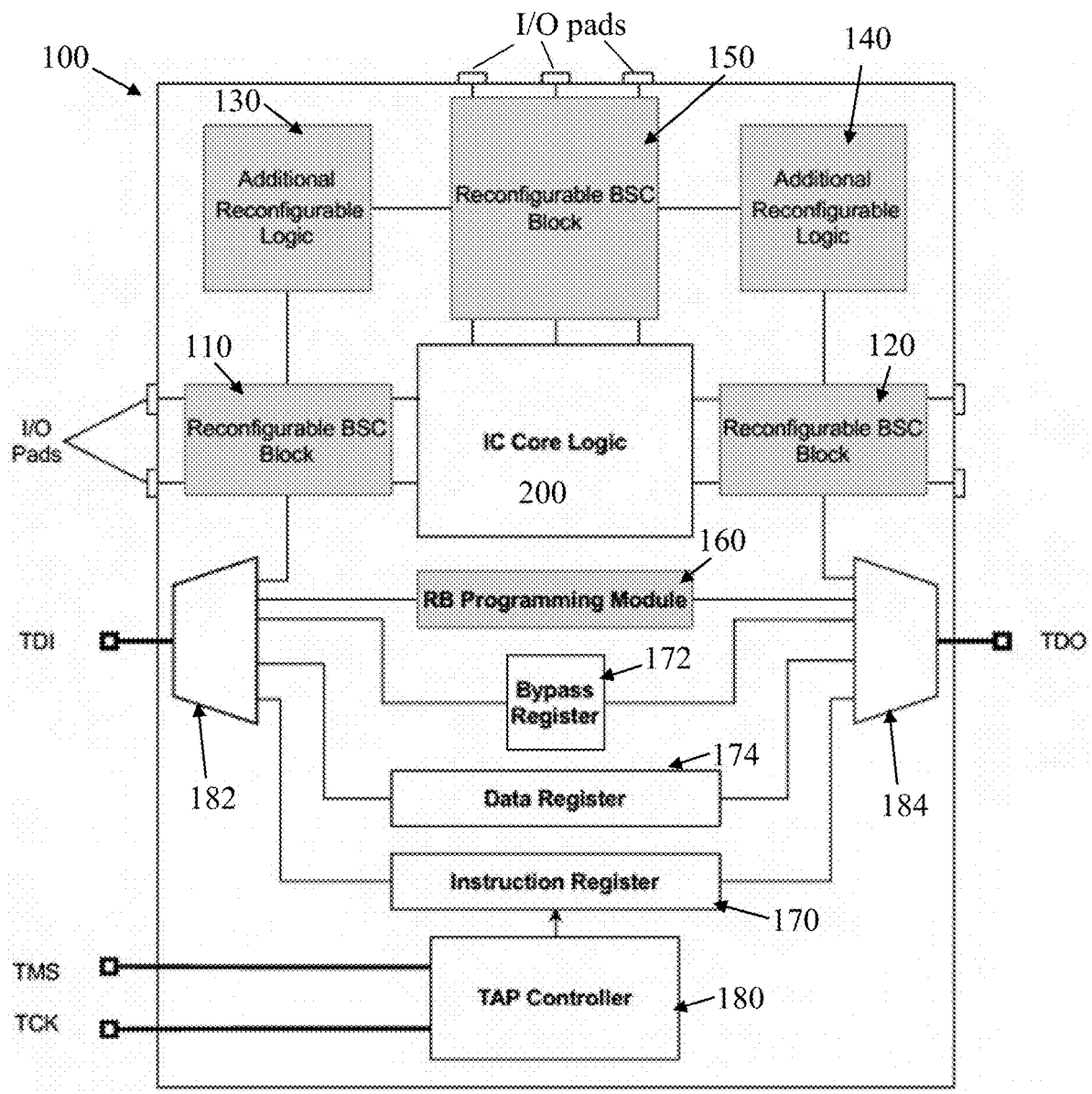
FIG. 1 is a simplified high-level block diagram of a reconfigurable JTAG architecture, in accordance with one embodiment of the present invention.

FIG. 1 is a simplified high-level block diagram of a reconfigurable JTAG architecture 100, in accordance with one embodiment of the present invention. Reconfigurable JTAG architecture 100 includes two layers of reconfigurable logic among the IC core logic, the boundary scan cells, and the I/O pins of the device. Reconfigurable JTAG (alternatively referred to herein as JTAG block) 100 is shown as including, in part, a core logic 200, reconfigurable blocks (RBs), and RB programming module 160. The RBs comprise first, second and third reconfigurable boundary scan chain (BSC) blocks 110, 120, 150, and additional reconfigurable logic (ARL) blocks 130 and 140. JTAG block 100 enables a user, e.g., a system integrator, to add or change security features to a circuit once the device is in the field. To achieve this, as shown, JTAG block 100 is adapted to include additional reconfigurable blocks around the boundary scan cells. The paths between the boundary scan chain and the I/O pins are modified so as to include the added functionality while ensuring that the JTAG's normal mode of operation, as defined by the relevant IEEE standards, e.g. 1149.1, are unchanged.

JTAG block 100, in addition to its normal mode of operation, enables, among other functions (i) I/O encryption using XOR gates or an encryption module that obfuscates the IC's I/O with a code, and (ii) timed locking using timers and counters that restrict the I/O access of the IC after a specified time interval.

As is well known, a boundary scan chain architecture enables design for test (DFT) and can be used to inspect interconnects on a circuit. Along with the JTAG, or IEEE 1149.1 standard, the boundary scan chain architecture can also be used to observe an internal point in a circuit or to shift in test patterns.

JTAG 100 includes a number of registers and a control interface. The registers include, in part, an instruction register and decoder 170, bypass register 172, boundary scan chain registers, device ID register (not shown in FIG. 1), and data registers 174. The control interface includes TAP controller 180, input terminals TDI, TMS, and TCK, and output terminal TDO.

Figure 2A:
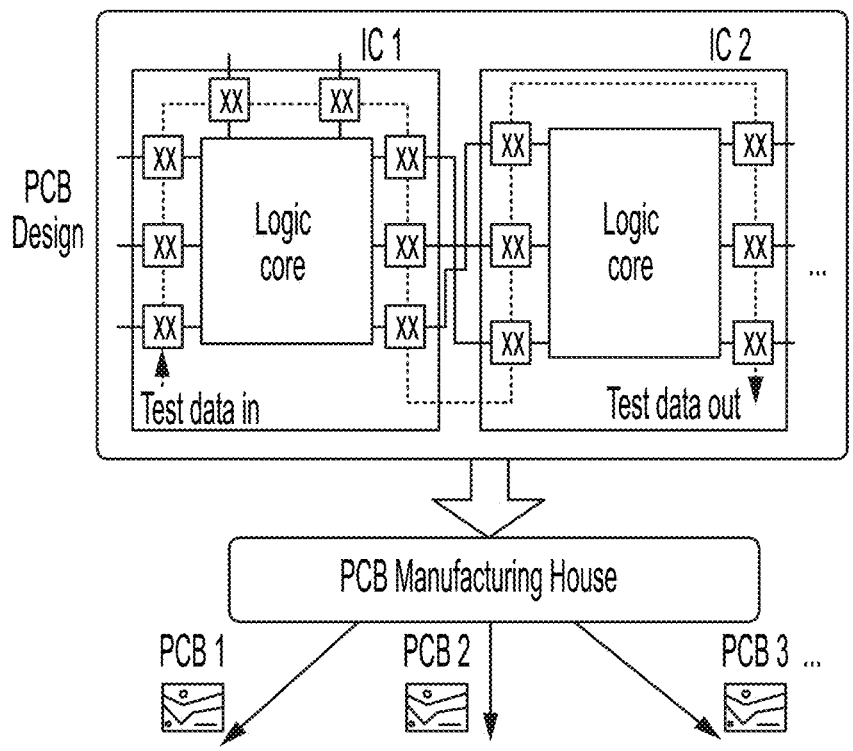
FIG. 2A is a high-level block diagram of a boundary scan chain connected to a pair of ICs and their data paths, in accordance with one embodiment of the present invention.

FIG. 2A is a high level block diagram of a boundary scan chain connecting to a pair of ICs and their data paths. The boundary scan chain includes shift registers that shift the data out through the JTAG interface. Additionally, data from the core logic, I/O pins, or input from the JTAG interface can be shifted in.

Figure 2B:
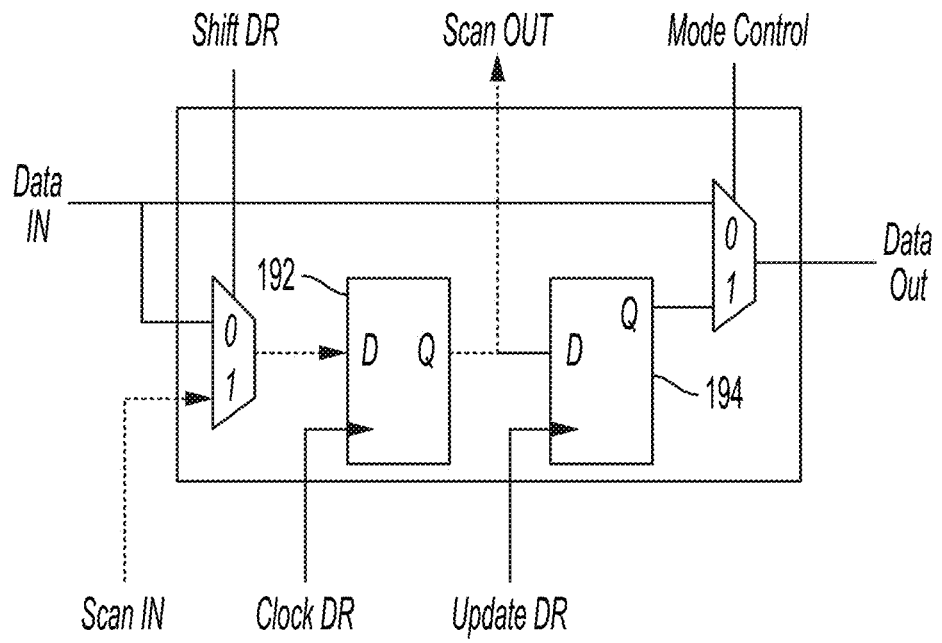
FIG. 2B is a schematic diagram of an exemplary boundary scan cells, in accordance with one embodiment of the present invention.

FIG. 2B is a schematic diagram of an exemplary boundary scan cells. The capture register 192 and update register 194 are used for sampling the input and storing the output. The registers are triggered by clock signals 'Clock DR' and 'Update DR', respectively. The capture register takes the incoming data which can then be passed to scan out or to the update register. The update register passes the data to the external I/O pins. Scan-in and scan-out signals enable the data to be transmitted between the boundary scan cells. Signal 'Shift DR' controls whether data will be sampled from the IC core logic or from the previous boundary scan cell's scan out. The 'Mode Control' signal allows for the registers to be bypassed when not in the test mode.

Figure 2C:
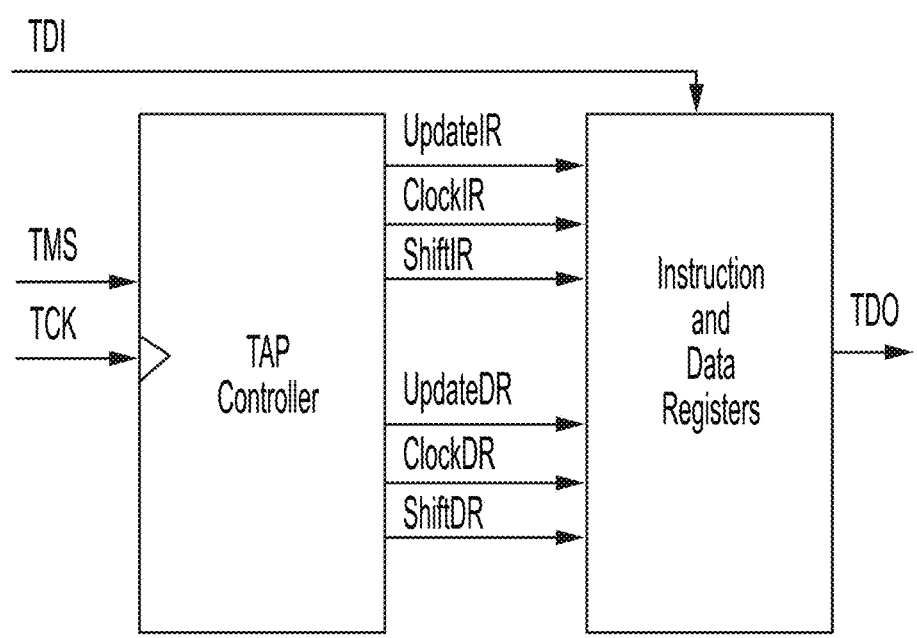
FIG. 2C is a high-level block diagram of the TAP controller of the JTAG of FIG. 1, in accordance with one embodiment of the present invention.

FIG. 2C is a high-level block diagram of the TAP controller coupled to the instruction and data registers using the signals as shown. The TAP controller includes a finite state machine which together with the input signals are used to set the control signals that, in turn, set the state of the instruction and data registers. Signal TCK operates as the clock signal for the JTAG block. Signal TMS is used for selecting the next state of the state machine. Signals TDI and TDO form the input and output of the selected registers. For example, the instruction register can store input which can then be decoded into the corresponding instruction (e.g., Sample, Preload, Extest). These instructions set the state of the multiplexers 182, 184 which control signals TDI and TDO. This enables the user to control which register is selected to be written into or read out from. One register can be selected at a time. Different registers contain different data paths and functions. The boundary scan chain can be used to load in test patterns and shift out internal signals for debugging. The bypass registers provide a direct path between TDI and TDO, thus allowing a user to pass through the data without affecting any system logic. Device ID register contains vendor information used to identify the device. Data registers are optionally used for system specific logic. For example, they could store the bit stream used to program the reconfigurable logic.

Referring to FIG. 1, reconfigurable blocks 110, 120, 130, 140 and 150, in accordance with embodiments of the present invention, are adapted to operate with the boundary scan cells and the I/Os of the IC. Reconfigurability is understood to mean that a user (e.g., a system integrator) can program these blocks to perform a desired function, i.e., locking, with respect to each boundary scan cell. By placing reconfigurable logic around the boundary scan cell, embodiments of the present invention can control the data coming from and to the I/O pads and boundary scan cells, thus reducing the possibility of leaking information and revealing design secrets. There are at least three types of RBs, namely Configurable Logic Blocks (CLB), Domain-Specific Reconfigurable Logic (DSRL) Blocks, and One-Time Programmable (OTP) memory.

Figure 3:
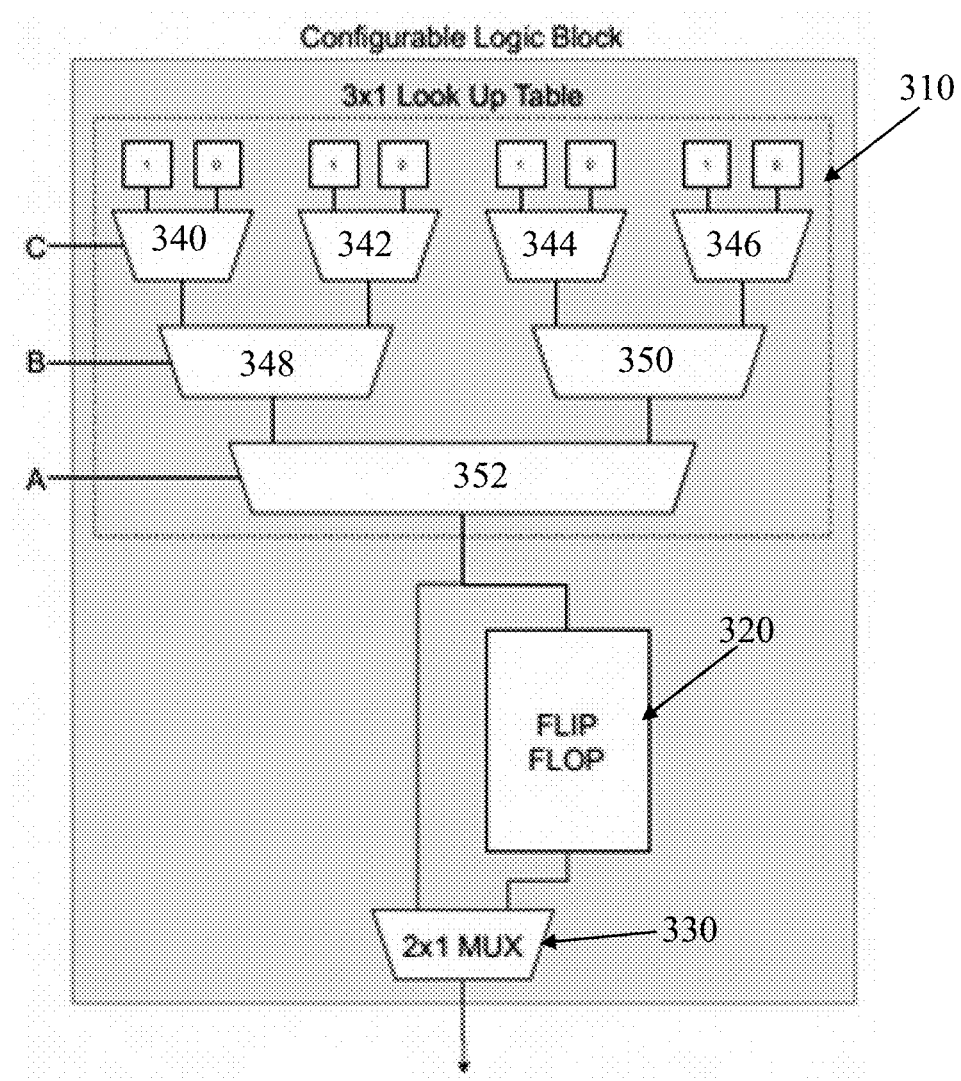
FIG. 3 is a block diagram of a configurable logic block, in accordance with one embodiment of the present invention.

The CLBs are a basic component in a reconfigurable devices, such as a field-programmable gate array (FPGA). A CLB includes a number of logic elements which can be reprogrammed. FIG. 3 is an example of a CLB which is shown as including three elements, namely a look up table (LUT) 310 whose output is configured as the truth-table of a Boolean function stored in a storage element preprogrammed by a bitstream; a flip flop (FF) 320 which operates as a memory element; and a multiplexer (MUX) 330 adapted to select between the outputs of the LUT 310 and FF 320.

The LUT enables different logic implementations to be reconfigured. The output of the LUT is determined during the configuration and not during the runtime. The outputs for a certain Boolean function can be configured for certain inputs and programmed in the LUT, thus allowing for such outputs to be selected when the correct input is provided. This can be seen in FIG. 3 where inputs A, B, and C determine the path from MUXes 340, 342, 344, 346, 348, 350 and 352 to the output.

Figure 4:
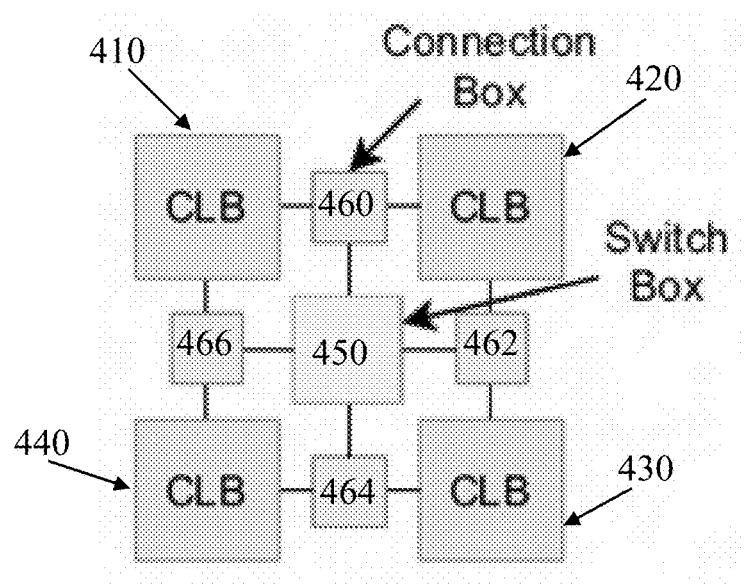
FIG. 4 shows a multitude of configurable logic blocks, connection boxes and a switch box, in accordance with one embodiment of the present invention.
Figure 5:
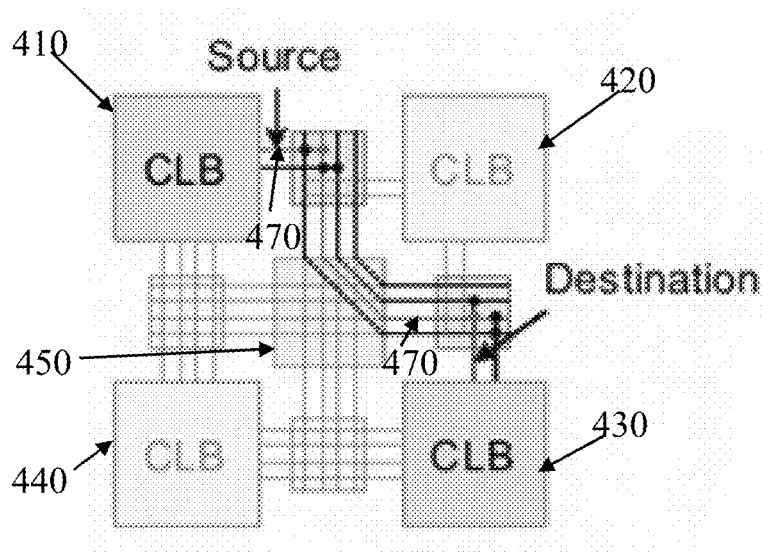
FIG. 5 shows an example of how the pair of configurable logic blocks of FIG. 4 are connected to one another via the connection and switch boxes, in accordance with one embodiment of the present invention.

Multiple CLBs are used to form a reconfigurable device and, as such, require routing between one another. Connection boxes and switch boxes connect the CLBs together. FIG. 4 shows, in part, four CLBs 410, 420, 430, 440, four connection boxes 460, 462, 464, 466 and a switch box 450. The configuration of FIG. 4 is referred to as an "island style" architecture. Connection boxes 460, 462, 464 and 466 connect the input and output of a CLB to wires that route throughout the device. The wires from a connection box go to the switch box, which includes switch matrices configured to route the paths of the connection boxes to one another. FIG. 5 shows an example of how the CLBs connect to one another through the connection and switch boxes. The source and destination for two CLBs 410 and 430 is identified with routing path 470. The dots on the switch box 450 indicate potential connections that could be made.

Figure 6:
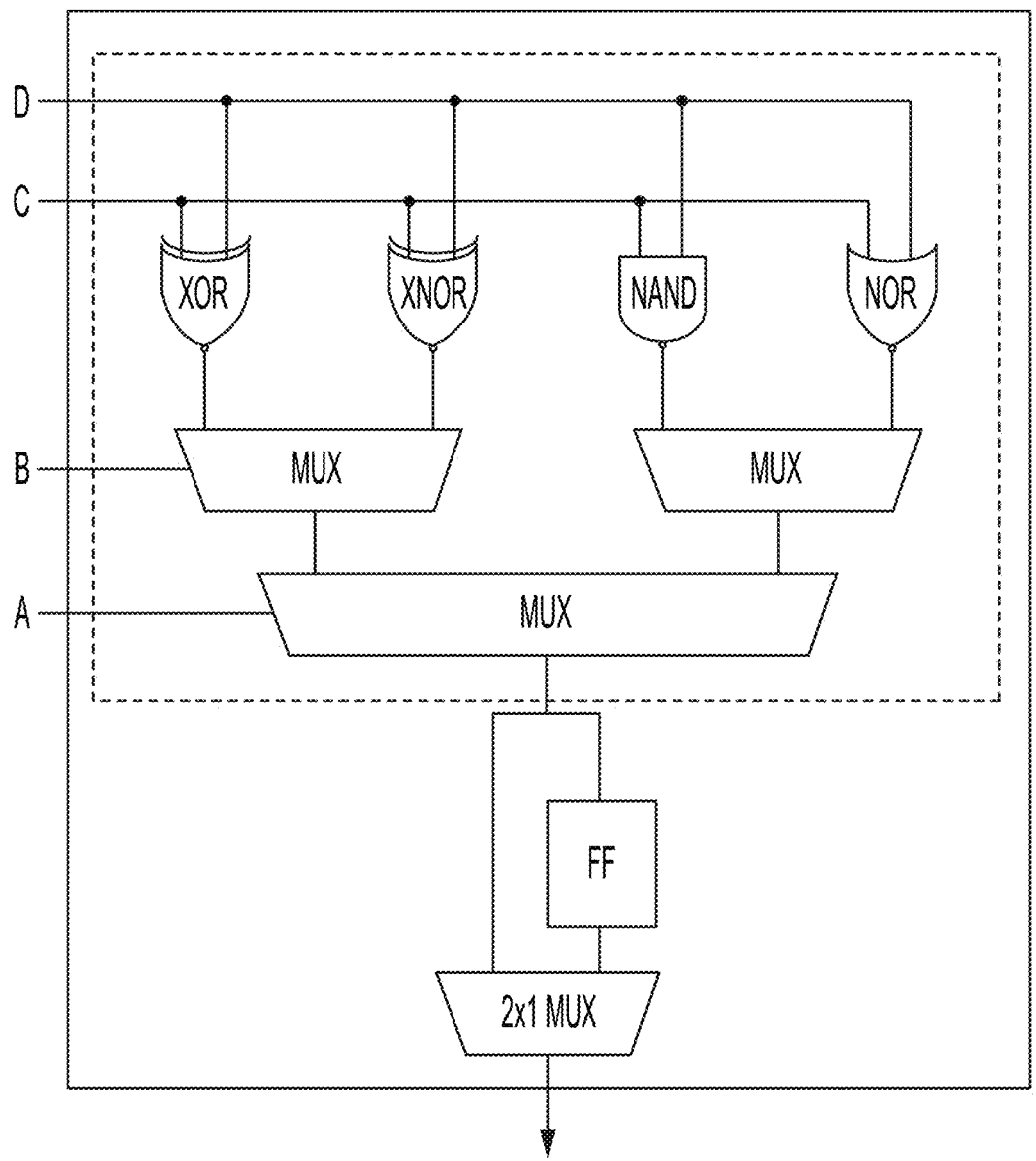
FIG. 6 shows various blocks of a domain-specific reconfigurable logic block, in accordance with one embodiment of the present invention.

While CLBs enable the full reconfigurability of the I/O locking mechanism, such a reconfigurable block can incur a significant area and power overhead, particularly for large designs. For designs with critical area and power requirements, DSRL blocks may be used. A DSRL block is less flexible and reconfigurable than a CLB. A DSRL block uses a restricted number of gates in each block and does not use a LUT. An exemplary implementation of a DSRL block with XOR, XNOR, NAND, and NOR gates is shown in FIG. 6. In this implementation, the XOR and XNOR gates can be used in combinational logic locking applications. The NAND and NOR gates are added due to their universality and flexibility in implementing Boolean functions. Replacing the LUT from a CLB with a configuration comprising the above four gates results in area and power saving but at the cost of limiting reconfigurability.

The reconfigurable blocks described above provide flexibility in altering a pre-programmed configuration (under authentication) of the JTAG chain inside an IC during its lifetime. The one-time programmable (OTP) based configurable fabric is another implementation of the reconfigurable blocks that sets the locking mechanism only once.

Figure 7:
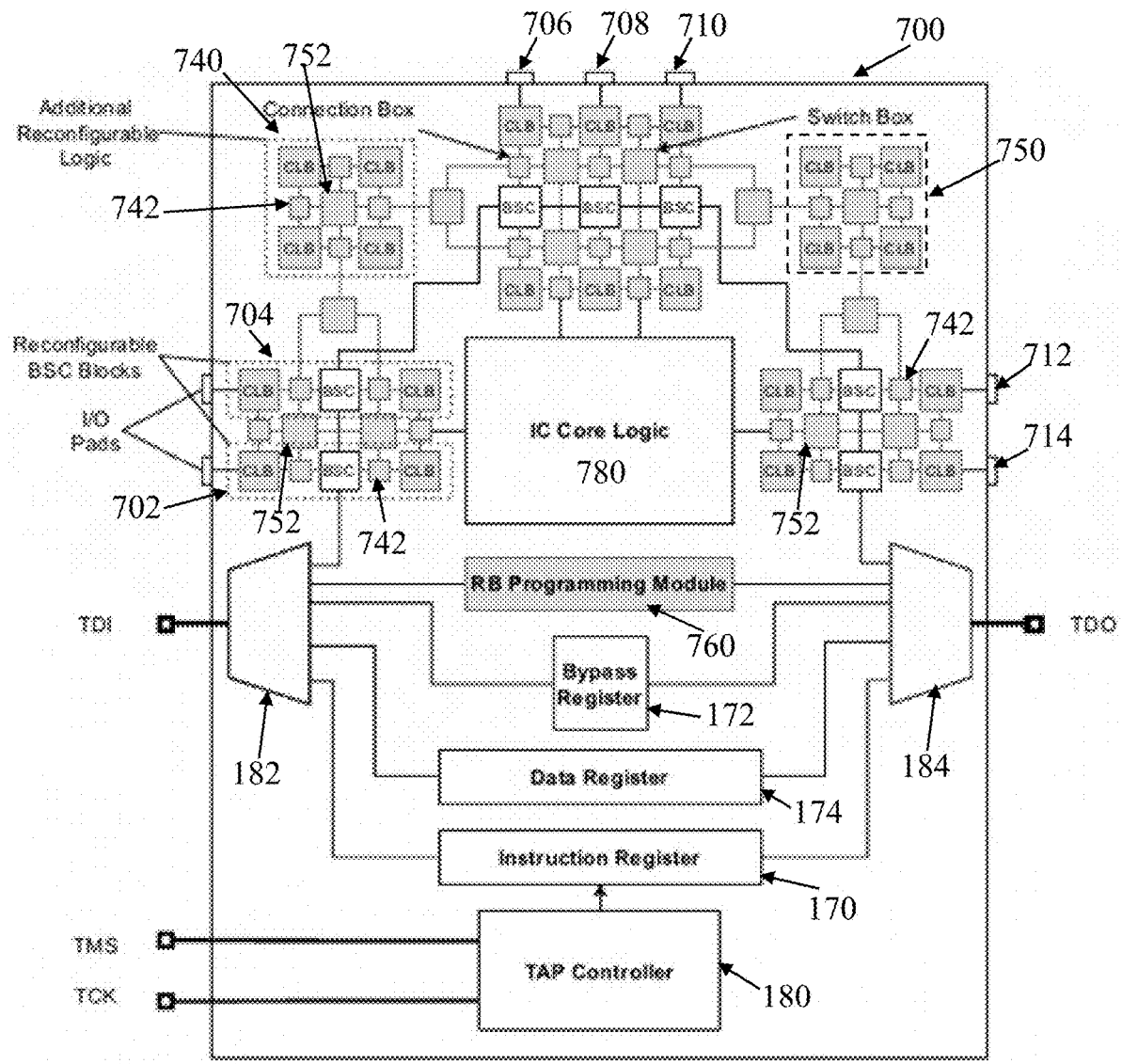
FIG. 7 is a high-level block diagram of a reconfigurable JTAG block, in accordance with one embodiment of the present invention.

FIG. 7 is a high-level block diagram, of a reconfigurable JTAG block 700, in accordance with one embodiment of the present invention. JTAG 700 is shown as including, in part, reconfigurable BSC blocks (RBB) 702, 704, 706, 708, 710, 712, 714, ARLs 740, 750, and a RB programming module 760 that is adapted to supply additional paths, in addition to the JTAG registers, for programming of the reconfigurable blocks. The connection boxes are shown as small squares, e.g. squares 742, and switch boxes are shown as squares that are equal in size to CLB boxes, e.g. squares 752.

Figure 8:
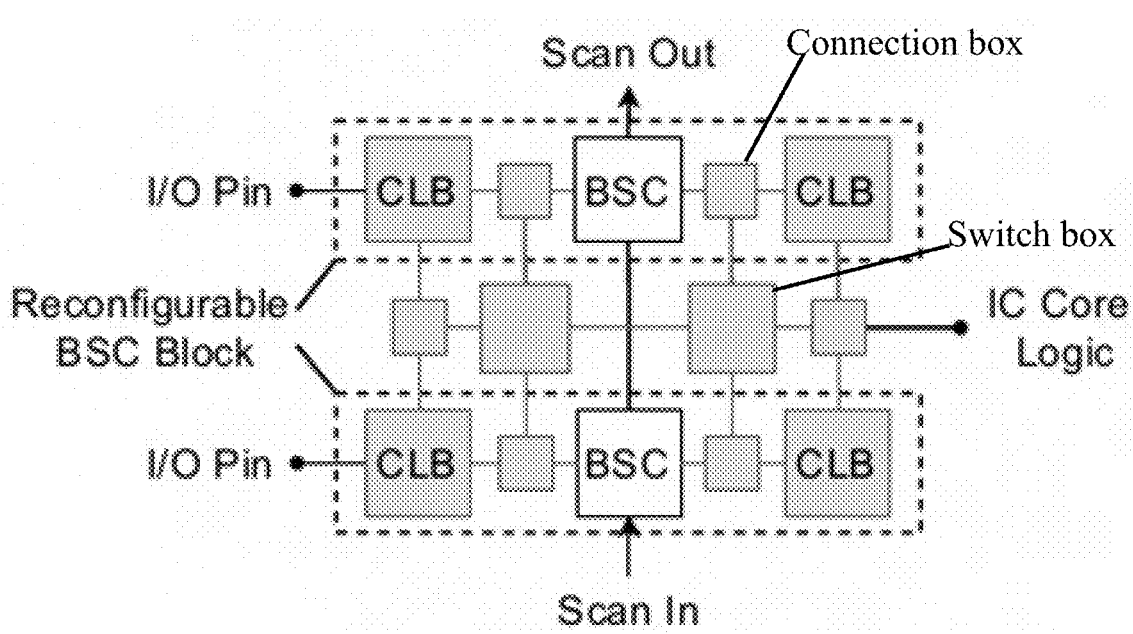
FIG. 8 shows a pair of reconfigurable boundary scan chain blocks, in accordance with one embodiment of the present invention.

As described further below, CLBs are used as reconfigurable blocks in JTAG 700 which, in accordance with some embodiments of the present invention, enable a user to implement his/her own locking schemes, in contrast to hard-coded logic used in conventional JTAGs. IC core logic 780 is adapted to be connected to the RBBs via the switch boxes. ARLs 740, 750 enable more complex locking schemes, such as those using timers and counters. ARLs 740, 750 are not connected directly to the boundary scan cells. FIG. 8 is a block diagram of a pair of RBBs. The CLBs are connected to each other in a back-to-back format. The RBBs are adapted to enable the implementation of locking schemes, such as XOR.

Referring to FIG. 7, the RBs may be programmed using RB programming module 760. Such a module interfaces with a non-volatile memory storing the bitstream that configure the RBs to perform a desired locking operations defined by the user. The programming process is similar to those used in an FPGA where the bitstream is shifted into all programmable elements of the RBs, such as LUTs in a CLB. As with FPGAs, the encrypted bitstream is stored in memory and requires a decryption module to configure the RBs.

As described above, a JTAG block, in accordance with embodiments of the present invention, is adapted to be used for testing system logic, and for controlling data that can be shifted into boundary scan chain. The RBBs disposed in a JTAG block are adapted to connect the existing boundary scan chain to reconfigurable logic elements, and further to provide an additional layer of logic between the IC core logic and I/O pins. The ARLs disposed in a JTAG block enable implementation of more complex logic, and may be used as global elements to enhance functionality. The RB programming module is adapted to interface with, for example, a non-volatile memory to store the bitstream for configuring the RBs, and to decode the stored bitstream if the bitstream is encrypted.

A JTAG block, in accordance with some embodiments of the present invention, enables a user to change the input and output pins of the JTAG block after fabrication. The scan chain cells can be routed to LUTs, which may be preprogrammed to operate as logic gates and not just as wires. For example, a simple stream cipher may be implemented by an XOR gate having one input receiving the data and another input receiving the encryption bit. If additional security functions are needed, a CLB connected to the boundary scan cell output can be reconfigured to provide the added functionality. In other words, embodiments of the present invention enable users/developers to either patch or update security features of an IC throughout the IC's life cycle.

As described above, a JTAG block, in accordance with some embodiments of the present invention, includes configurable logic surrounding the boundary scan chain. The boundary scan cells are grouped together with configurable logic to form an RBB. As was also described above with reference to FIG. 8, an RBB includes at least one CLB adapted to be connected to the IC core logic (IC CLB) and the boundary scan cell, and a CLB that routes to the I/O pin (I/O CLB). The IC CLB either takes the IC logic as input or routes input from the I/O pin; it may also receive any additional signals, such as key bits or enable signals, to route to the rest of the RBB. The IC CLB may connect to the boundary scan cell, either by passing the IC output or receiving inputs. The boundary scan cell receives input and delivers its output to an adjacent CLBs instead of directly delivering its output to the I/O or IC logic. The scan in and scan out connections directly connect to an adjacent boundary scan cell instead of passing through a CB. The I/O CLB connects to the I/O pin of the circuit and routes data to or from it. Additional logic can be configured in-between the I/O pin while maintaining compliance with JTAG boundary scan chain requirements.

Figure 9:
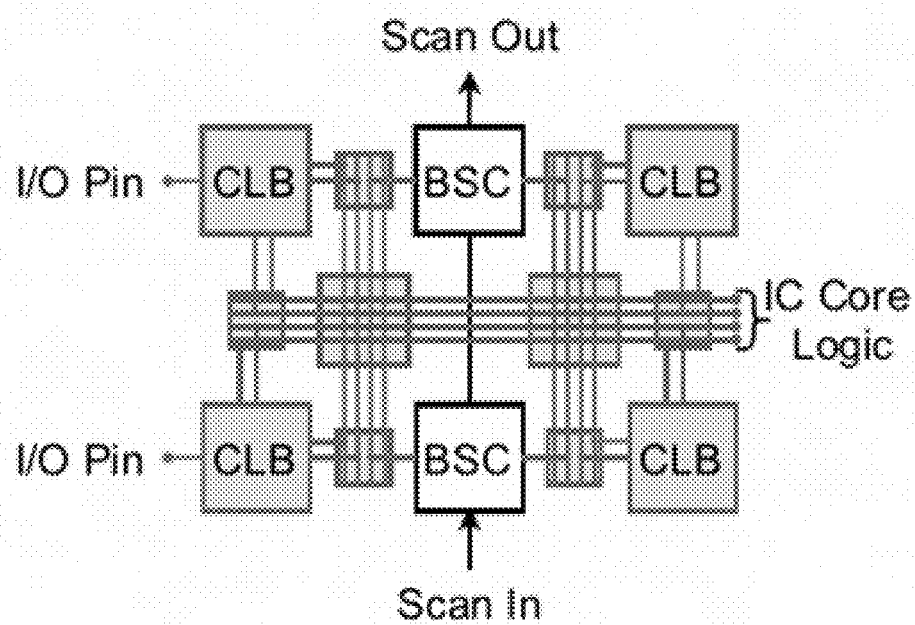
FIG. 9 shows an exemplary connection between the reconfigurable boundary scan chain blocks of FIG. 8, in accordance with one embodiment of the present invention.

Due to the decreased complexity and size of the reconfigurable logic, routing between RBBs is simplified and involves only the connection boxes (CBs) and switch boxes (SBs). The connections between a pair of RBBs is shown in FIG. 9. As shown, incoming data from the IC core logic first passes through a CB before being routed to another selected CLB. Such data may be I/O data as well as, for example, key bits. Data from different RBBs may be shared via the CLBs.

An ARL is adapted to perform logic implementations that can't be accommodated by an RBB due to size limitations, or is not suited for implementation by an RBB, and/or relates to a structure shared between multiple RBBs. As seen in FIG. 7, an ARL is disposed between groups of RBBs to provide the JTAG with more flexibility for implementing security features or logic. For example, it is more efficient to form a timer on one of the ARLs and share the timer with multiple RBBs. Since a counter can take up multiple LUTs, this ensures that the RBBs have adequate resources for input and output functions while providing a shared resource.

A JTAG block, in accordance with embodiments of the present invention, provides the ability to program a device using the boundary scan chain by interfacing with a non-volatile memory that stores firmware or the bitstream. As described above, embodiments of the present invention include a programming module, such as programming module 160 shown in FIG. 1, adapted to program the reconfigurable blocks from the RBBs and the ARLs. The programming module is in a separate path from the known JTAG registers, such as the instruction register, data register, and bypass register. The bitstream of such RBs is stored separately in a non-volatile memory, such as flash, with which the programming module interfaces. The bitstream may be stored in an encrypted form in a flash memory. A decryption engine that may also be disposed in the programming module parses the correct bitstream to the RBs. As the RBs are connected back-to-back (in a manner similar to that used in an FPGA) the decrypted bitstream is delivered to a programmable shift register disposed in the reconfigurable blocks.

The following applications of the embodiments of the present invention are based on additional functionality between the core IC logic and the I/O ports. Such functionality may be used to add more security features, update existing measures, or change the output logic. The following applications demonstrate the adding of a simple stream cipher allowing I/O encryption as well as an additional timing based I/O locking mechanism.

Encryption of I/O Ports

Figure 10:
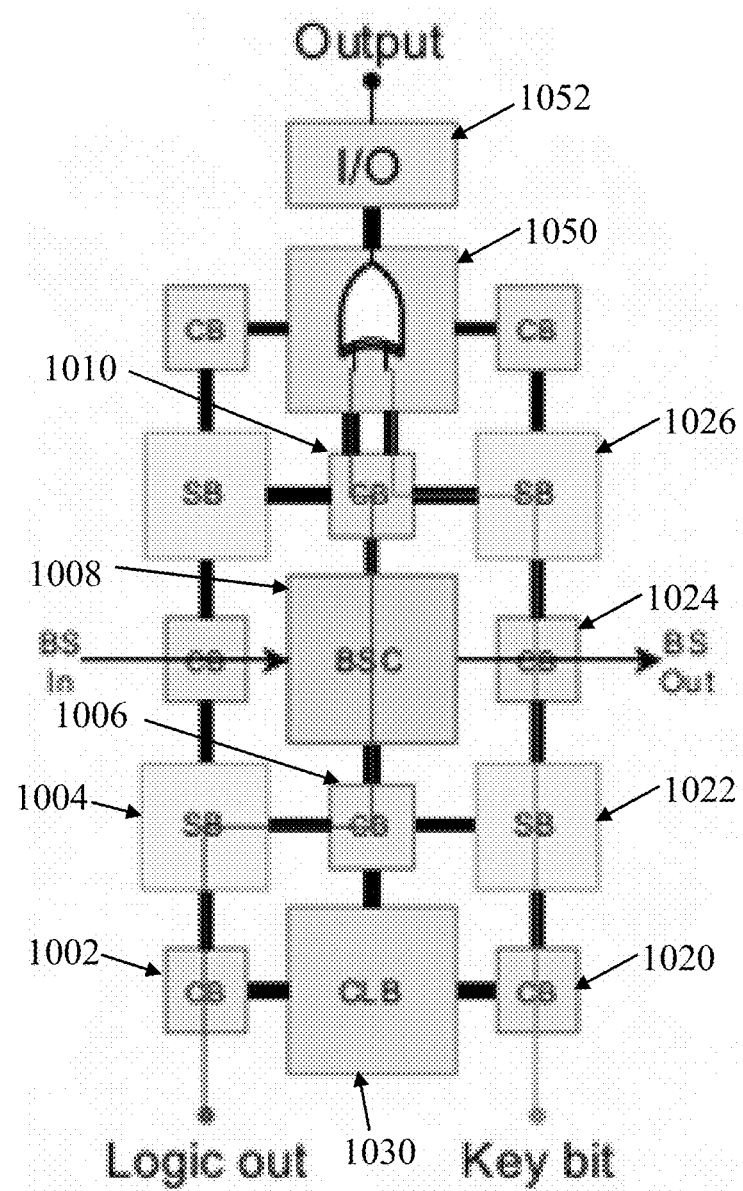
FIG. 10 shows the JTAG of FIG. 1 configured to perform a stream cipher algorithm, in accordance with one embodiment of the present invention.

A stream cipher is an encryption algorithm which combines data representative of a plain text data with a corresponding key bit. One common method for implementing the algorithm is through a XOR gate, where one input is the data and the other is the key bit. The output is then the encrypted data bit. An RBB disposed in a JTAG block, in accordance with some embodiments of the present invention, may be configured as a stream cipher to perform I/O encryption. FIG. 10 shows an example of a stream cipher being implemented to encrypt data at the I/O pins. Data routed from the IC core (identified as signal "Logic_Out") is received and passed via CB 1002, SB 1004, CB 1006, BSC 1008, and CB 1010 to CLB 1050. The key bit (identified using signal "Key_bit") is received and passed via CB 1020, SB 1022, CB 1024, SB 1026, and CB 1010 to CLB 1050. CLB 1050 is configured as an XOR gate to perform the encryption. The output of the XOR gate is delivered as an output via I/O block 1052.

Timed Locking of I/O Ports

Figure 11:
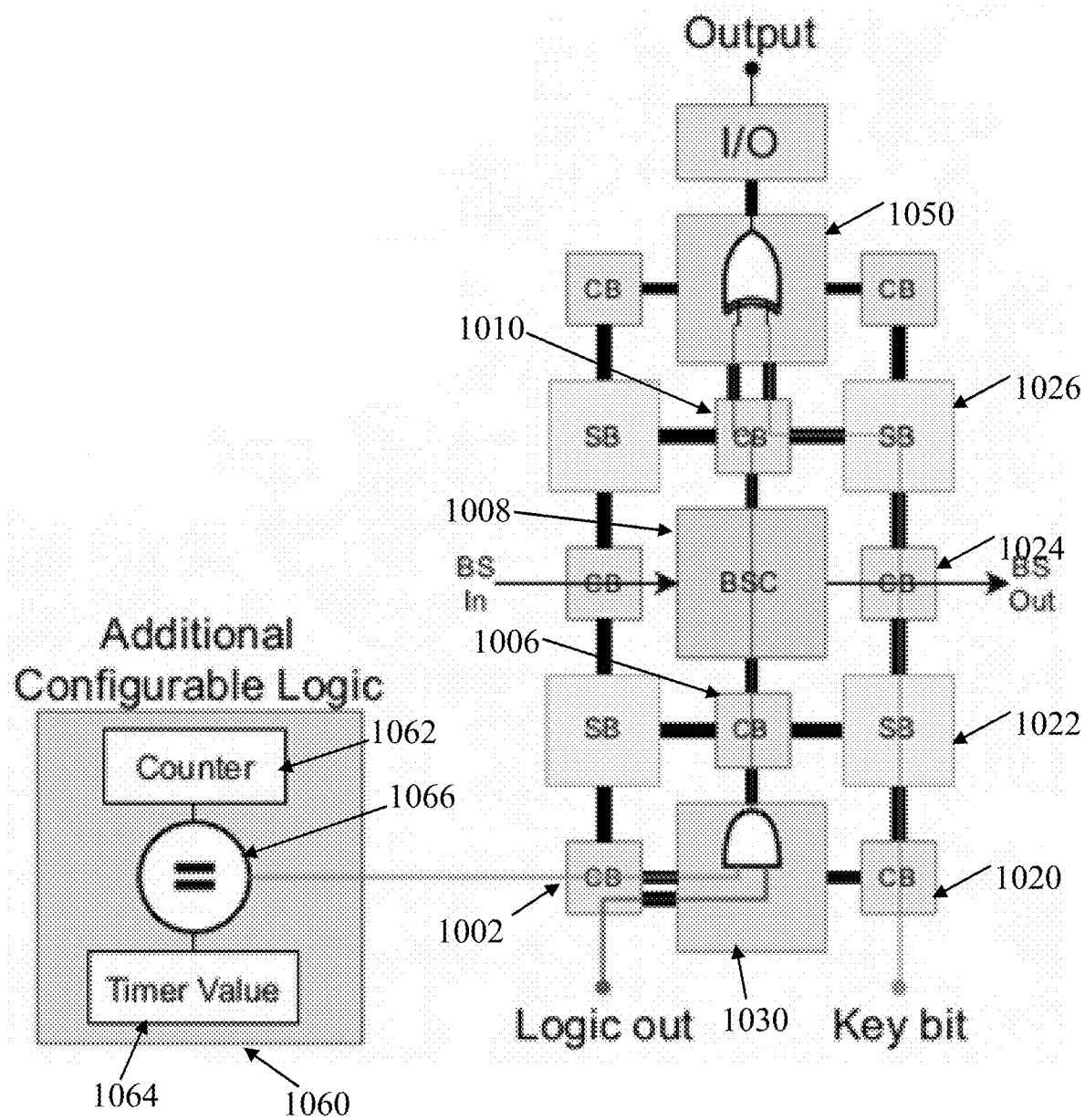
FIG. 11 shows the JTAG of FIG. 1 configured to perform timed-locking of the I/O ports, in accordance with one embodiment of the present invention.

FIG. 11 shows how a JTAG block, in accordance with some embodiments of the present invention, may be configured to lock the I/O ports after the expiration of a predefined time interval. The timed locking protects the output from the IC core logic to the I/O pad. ARL 1060 is configured to determine, using equivalence operator 1066, whether counter 1062's count has reached the pre-programmed timer value. Counter 1062, timer value register 1064, and equivalence operator 1066 are implemented in ARL 1060.

The output of equivalence operator 1066 is delivered to CLB 1030 via CB 1002, Data routed from the IC core (identified as signal "Logic_Out") is received and delivered via CB 1002 to CLB 1030. CLB 1030 is configured as an AND gate to perform an AND operation on the two signal it receives. The output of the AND gate is delivered via CB 1006, BSC 1008 and CB 1010 to CLB 1050. The key bit (identified using signal "Key_bit") is received and delivered via CB 1020, SB 1022, CB 1024, SB 1026, and CB 1010 to CLB 1050. CLB 1050 is configured as an XOR gate to perform the locking operation.

Built-In Self-Test

A JTAG block, in accordance with embodiments of the present invention, may be configured to perform non-security functions, such as testing. The following is a description of how the JTAG block may be used to perform built-in self-testing (BIST). BIST enables a device to test itself. BIST includes three main components, namely a test pattern generator, a response analyzer, and a BIST controller. The test pattern generator may be implemented as a pseudo random number generator, such as a linear feedback shift register (LFSR), to generate a set of patterns over a certain time period. The response of the circuit to the inputs may then be determine and stored. The response analyzer is then used to determine if the test passes or fails by comparing the stored responses to the expected responses.

Figure 12:
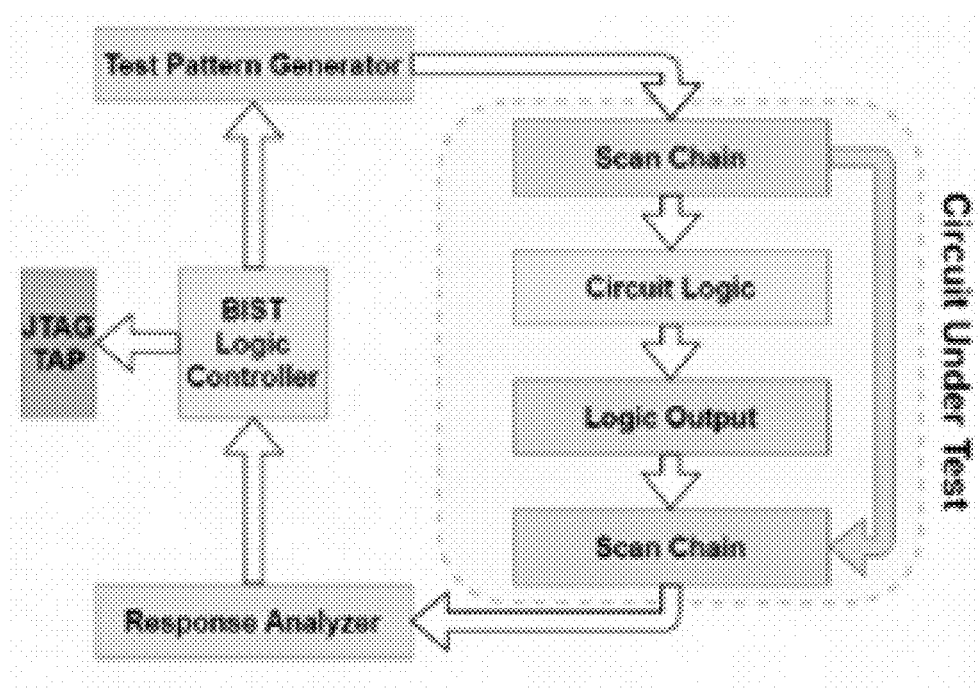
FIG. 12 shows a BIST logic as known in the prior art.

The BIST controller is responsible for starting the test generation and response collection and sending pass or fail results. Additionally, the output can be compressed in order to reduce the amount of memory needed for the responses. FIG. 12 shows a conventional BIST logic. As seen, the test pattern generator shifts the pattern into the scan chain where it is applied to the circuit logic. The output is then sent to the response analyzer which the BIST controller uses to determine if the test passes or failed. Results of the test are then transmitted using the JTAG TAP interface.

Figure 13:
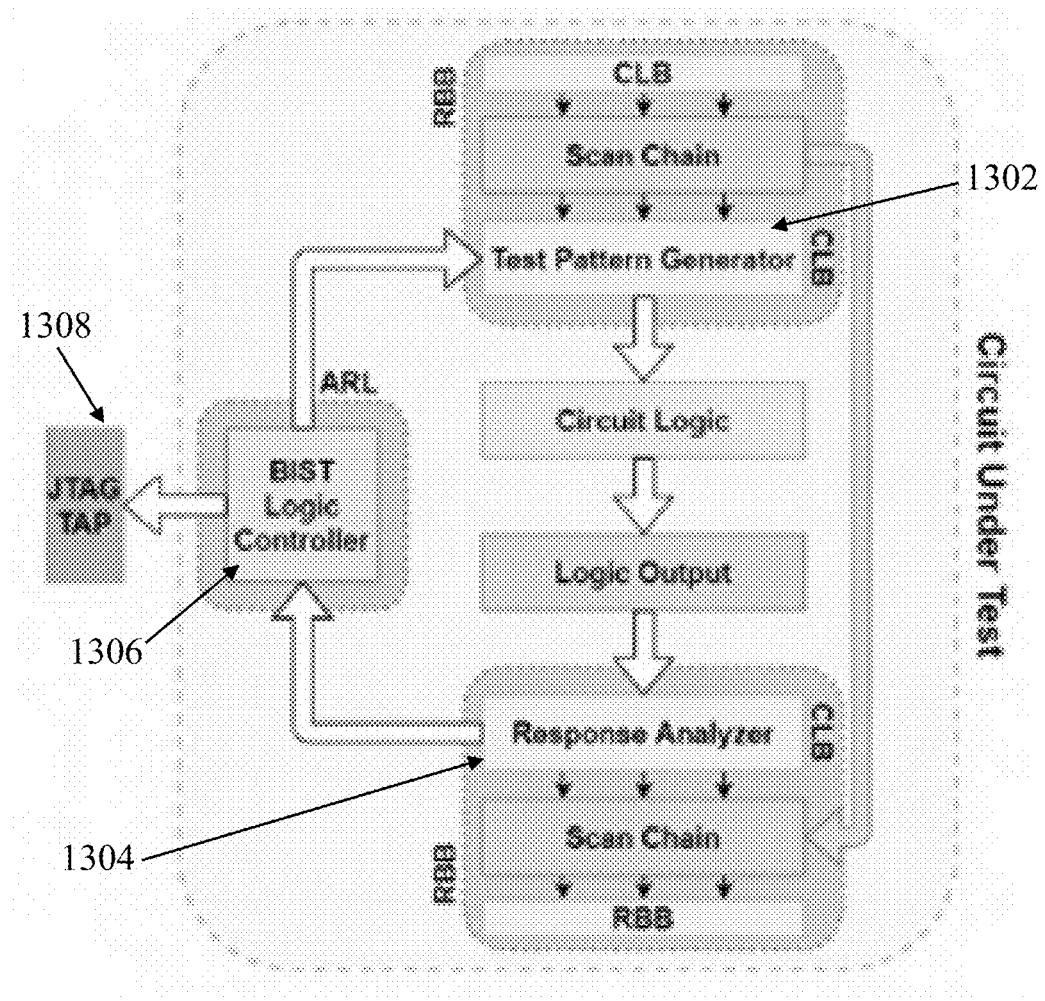
FIG. 13 shows the JTAG of FIG. 1 configured to operate as a BIST logic, in accordance with one embodiment of the present invention.

FIG. 13 shows a JTAG block, in accordance with embodiments of the present invention, configured to perform BIST. Test patterns are generated using RBB 1302 that is configured as a LFSR and disposed on the input side. The RBB 1304—disposed on the output side—is configured to operate as a response analyzer to compare the output to the expected responses. The results of the comparison are then sent to BIST controller 1036 which is implemented in an ARL. The output of BIST controller 1036 is sent through the JTAG TAP interface 1308. This allows for faster generation and application of test patterns as they are generated directly at the input of the circuit logic and can be applied as input as soon as they are ready. Otherwise they need to be shifted in through the scan chain which takes time. The response analyzer receives circuit output directly and does not need to have it shifted through the scan chain or pass through additional elements.

What is claimed is:

1. A reconfigurable JTAG comprising:
   a core logic;
   a boundary scan chain cell;
   one or more reconfigurable boundary scan chain blocks (RBBs) adapted to couple the boundary scan chain cell to the core logic and to input/output (I/O) ports of the reconfigurable JTAG, wherein each of the one or more RBBs comprises at least two configurable logic blocks (CLBs), wherein a first CLB of the at least two CLBs couples the boundary scan chain cell to the core logic and a second CLB of the at least two CLBs couples the boundary scan chain cell to the I/O ports of the reconfigurable JTAG; and
   one or more additional reconfigurable logic (ARL) blocks adapted to provide enhanced logic that cannot be accommodated by the one or more RBBs.

2. The reconfigurable JTAG of claim 1 further comprising:
   a reconfigurable block (RB) programming module adapted to communicate with a memory storing data for configuring the RBBs and ARLs.

3. The reconfigurable JTAG of claim 2 wherein said RBBs and ARLs are configured to disable access to the I/O ports of the JTAG.

4. The reconfigurable JTAG of claim 2 wherein said reconfigurable JTAG complies with IEEE 1149.1 standard.

5. The reconfigurable JTAG of claim 2 wherein said RBBs is configured to encrypt the I/O ports in accordance with a stream cipher algorithm.

6. The reconfigurable JTAG of claim 2 wherein said RBBs and ARLs are configured to compare a counter's count to a predefined time and lock the I/O ports after an expiration of the predefined time.

7. The reconfigurable JTAG of claim 2 wherein said RBBs and ARLs comprise at least one of configurable logic blocks (CLB), domain-specific reconfigurable logic (DSRL) blocks, or one-time programmable (OPT) memory.

8. The reconfigurable JTAG of claim 2 wherein each of said ARLs is coupled to a plurality of said RBBs.

9. The reconfigurable JTAG of claim 2 wherein at least one of said ARLs is configured as at least one of a timer or a counter.

10. A method for protecting input/output (I/O) ports of a reconfigurable JTAG, the method comprising:
    configuring one or more reconfigurable blocks (RB) disposed in the reconfigurable JTAG to disable access to the I/O ports of the reconfigurable JTAG, wherein the reconfigurable JTAG comprises:
    a core logic,
    a boundary scan chain cell,
    the one or more RBs, wherein the one or more RBs comprises one or more reconfigurable boundary scan chain blocks (RBBs) adapted to couple the boundary scan chain cell to the core logic and to the I/O ports of the reconfigurable JTAG, wherein each of the one or more RBBs comprises at least two configurable logic blocks (CLBs), wherein a first CLB of the at least two CLBs couples the boundary scan chain cell to the core logic and a second CLB of the at least two CLBs couples the boundary scan chain cell to the I/O ports of the reconfigurable JTAG, and one or more additional reconfigurable logic (ARL) blocks adapted to provide enhanced logic that cannot be accommodated by the one or more RBBs.

11. The method of claim 10 further comprising:

configuring a reconfigurable block (RB) programming module to communicate with a memory storing data for configuring the RBBs and ARLs, wherein the RB programming module is disposed in the reconfigurable JTAG; and configuring the RB programming module to configure the RBBs and ARLs to perform certain locking operations based at least in part on the data stored in the memory.

12. The method of claim 10 wherein configuring the RBs to disable access to the I/O ports of the reconfigurable JTAG comprises configuring the RBBs to encrypt the I/O ports in accordance with a stream cipher algorithm.

13. The method of claim 10 wherein configuring the RBs to disable access to the I/O ports of the reconfigurable JTAG comprises configuring the RBBs and ARLs to compare a counter's count to a predefined time and lock the I/O ports after an expiration of the predefined time.

14. The method of claim 10 wherein the reconfigurable JTAG complies with IEEE 1149.1 standard.

15. The method of claim 10 wherein the RBBs and ARLs comprise at least one of configurable logic blocks (CLB), domain-specific reconfigurable logic (DSRL) blocks, or one-time programmable (OPT) memory.

16. The method of claim 10 wherein each of the ARLs is coupled to a plurality of the RBBs.

17. The method of claim 10 wherein at least one of the ARLs is configured as at least one of a timer or a counter.

* * * * *